United States Patent

Au

Patent Number: 6,051,844
Date of Patent: Apr. 18, 2000

[54] SCANNING SYSTEM FOR RAPID THERMAL CYCLE STRESS/CURVATURE MEASUREMENT

[76] Inventor: Henry H. Au, 4462 Stoneyhaven Way, San Jose, Calif. 95111

[21] Appl. No.: 08/908,752

[22] Filed: Aug. 8, 1997

[51] Int. Cl.[7] .............................. G01L 1/24; G01B 11/00
[52] U.S. Cl. ........................ 250/559.06; 356/376; 438/14
[58] Field of Search .................. 250/559.06, 559.22, 250/559.23, 559.24, 559.4; 356/376, 35; 438/14

[56] References Cited

U.S. PATENT DOCUMENTS

| | | | |
|---|---|---|---|
| 5,270,560 | 12/1993 | Cheng | 250/559.23 |
| 5,506,672 | 4/1996 | Moslehi | 356/35.5 |
| 5,696,383 | 12/1997 | Cheng | 250/559.22 |
| 5,848,122 | 12/1998 | Kurtz | 378/80 |

Primary Examiner—Edward P. Westin
Assistant Examiner—Thanh X. Luu

[57] ABSTRACT

Accurate measurements of substrate surface curvature are effected by scanning the substrate in a scan direction along a diameter thereof and rotating it during rapid thermal processing (RTP). Rotation of the substrate also achieves more uniform heating of the substrate by exposing it uniformly to the radiant heat sources employed in the processing system. The heat sources are controllably energized in accordance with temperature measurements which provide feedback control for efficient and accurate cycling of the semiconductor wafer. Various methods are contemplated to effect the temperature measurement.

5 Claims, 7 Drawing Sheets

SCANNING SYSTEM FOR RAPID THERMAL CYCLE STRESS/CURVATURE MEASUREMENT

BACKGROUND OF THE INVENTION

1. Field of the Invention

The invention relates to diagnostic systems for semiconductor substrates, and more particularly, to systems for measuring substrate curvature and stress during rapid thermal processing (RTP) cycles.

2. State of The Art

During the manufacture of semiconductor wafers, it is conventional practice to form one or more thin film layers on the surface of a single semiconductor wafer to serve as a substrate for integrated circuits. The surface films can comprise, for example, silicon dioxide, AlSi, Ti, TiN, PECVD oxide, PECVD oxynitride, doped glasses, silicides, and so forth. The thickness of such films typically ranges from about 500 to about 12,000 Angstroms.

When manufacturing semiconductor integrated circuity, it is important to have minimal stresses in surface films on the underlying substrates. The surface stresses can cause, for instance, silicide lifting, the formation of voids and cracks, and other conditions that adversely affect integrated circuit semiconductor devices that are fabricated on the wafers. The surface stresses are especially problematical in large-scale integration and very large-scale circuit integrations.

Stress in surface films on semiconductor wafers can be characterized as either of the compressive or tensile type. Both stress types can cause slight curvatures in the surface of a semiconductor wafer—that is, the stresses can cause the surface of a semiconductor wafer to deviate from exact planarity. Typically, the extent of deviation is quantified in terms of the surface's radius of curvature. In practice, the radius of curvature of a semiconductor wafer is often measured in kilometers—or even hundreds of kilometers—while the diameter of a semiconductor wafer is measured in millimeters, and the depths of the surface layer films are measured in angstroms.

Detection of stresses in surface films on semiconductor wafers is important in semiconductor fabrication operations. The measurements can be used, for example, to identify wafers that are likely to provide low yields. Also, the measurements can be used to identify wafers that are likely to produce failure-prone semiconductor devices.

As mentioned above, stresses in surface films are not measured directly but, instead, are inferred from measurements of the radius of curvature of the surface of interest. In mathematical terms, surface film stresses are often expressed by a function that includes Young's modulus for the silicon substrate portion of the wafer, the Poisson ratio for the substrate, the thickness of the substrate, the film thickness, and the radius of curvature of the wafer due to surface film stress. As a matter of convention, negative values of a radius of curvature indicate compressive stress and positive values indicate tensile stress.

Figure 1:
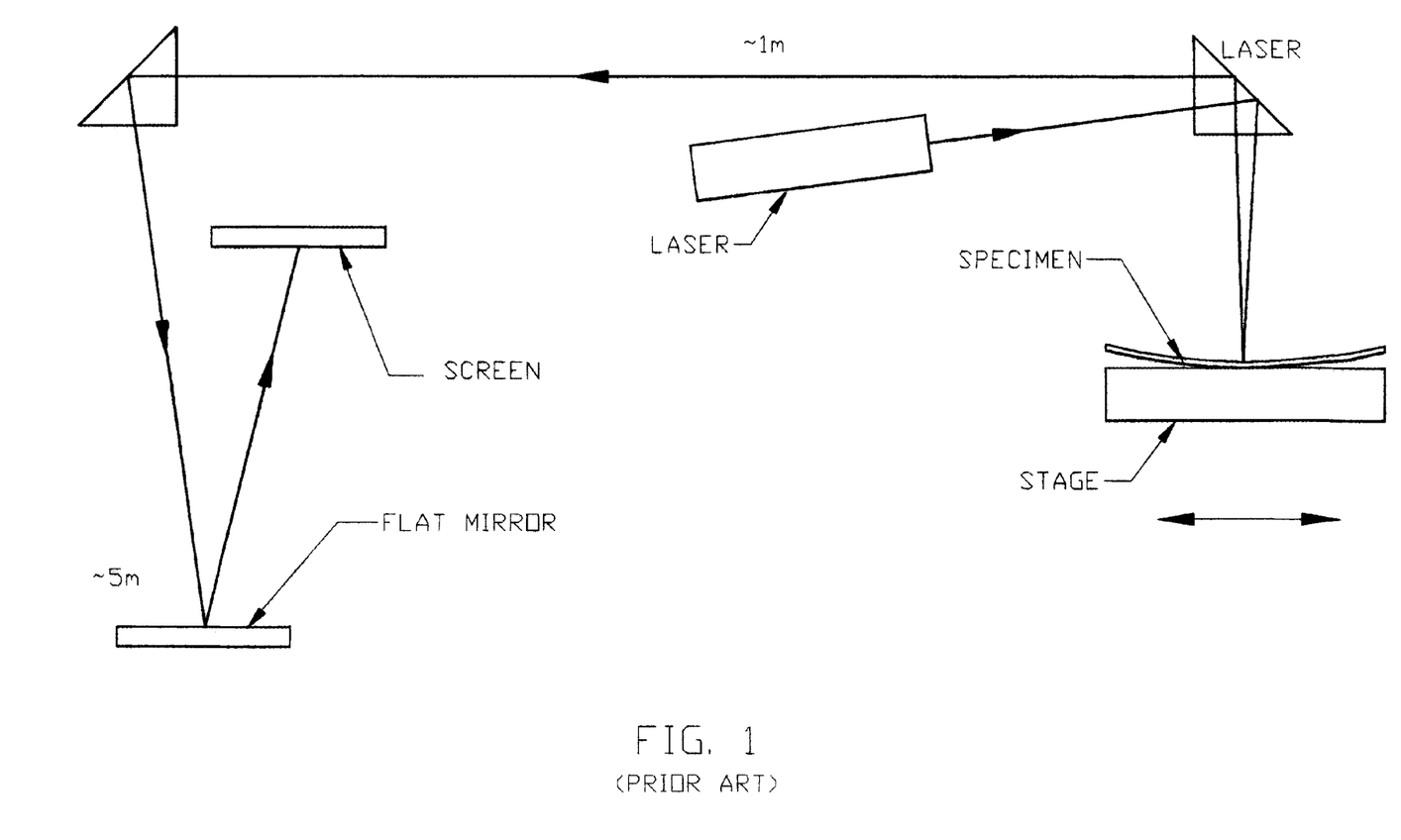
FIG. 1 is a schematic view showing a prior art curvature measuring device.

FIG. 1 shows an example of a known system for making laboratory measurements of surface curvatures of semiconductor wafers. In the system, a beam of laser light is directed onto the surface of a semiconductor wafer and the reflected light is projected onto a screen. If the wafer surface has a radius of curvature, the location at which the reflected light strikes the screen will change as the wafer is moved perpendicularly to the beam. By measuring both the distance that a wafer is moved and the resulting distance that a beam of reflected light moves across the screen, the wafer's radius of curvature can be determined.

In mathematical terms, the radius of curvature (R) of a wafer can be related to measurements provided by the system of FIG. 1 as follows:

$$R = 2L(\delta x/\delta d) \tag{1}$$

where $\delta x$ is the distance of translation of the wafer, $\delta d$ is the resulting translation of the spot formed by the reflected beam on the screen, and L is the distance traveled by the reflected beam. In the system shown, the beam travel distance is about ten meters (i.e., L=10 meters). These systems—often referred to as optically levered systems—are further described in *Thermal Stresses and Cracking Resistance of Dielectric Films on Si Substrates*, A. K. Sinha et. al., *Journal of Applied Physics* vol. 49, pp. 2423–2426, 1978. In practice, calibration of such systems is difficult and normally requires two or more standard reference surfaces.

The calibration problem is addressed in U.S. Pat. Nos. 5,270,560, 5,233,201, 5,227,641, and 5,118,955 all to Cheng and incorporated herein by reference. The Cheng patents provide self-calibrating systems which track the incidence of the measuring light beam on the sensing device by using differential signals generated by bifurcated sensors. The differential signals are used to control a relative translation between the sensor and the substrate, which translation serves to keep the system in proper alignment.

Semiconductor stress analysis may be a dynamic process, in which a substrate is subjected to various stress changing conditions requiring close monitoring and control. Radiant heat systems for cycling silicon wafers and elevated temperature gas processing are common in the industry, and various methods are utilized to improve temperature uniformity as described in U.S. Pat. No. 3,836,752 issued to Anderson and U.S. Pat. No. 4,680,451 issued to Gat. It is also well known to provide the combination of laser scanning on a single diameter scan line for the development of surface curvature measurements during temperature cycling of the wafer.

However, there is a need for more accurate diagnosis of substrate behavior in response to changing stress inducing conditions, such as heat changes during rapid thermal processing (RTP). RTP cycles, which involve deposition of material coatings on the substrate under various extreme heating conditions, induce structural stresses whose measurement and diagnosis are critical for effecting quality control, behavior prediction and overall improvements in semiconductor manufacturing processes. Improved, in situ measurement techniques during rapid thermal processing would therefore significantly advance the state of the art.

SUMMARY OF THE INVENTION

The invention provides an improved system for measuring surface curvature of a semiconductor substrate during rapid thermal processing of the substrate. The substrate surface is scanned by a sensing means which generates an output indicative of the curvature of the substrate as it undergoes rapid thermal processing. In a preferred embodiment, the substrate is rotated and a relative translation is effected between the sensing means and the substrate to thereby develop a data map of the curvature of the substrate.

The rapid thermal cycle stress/curvature measurement scanning system of the invention combines radiant heat sources for thermal cycling silicon wafers with a rotational suscepter which rotates the wafer in the radiant heat zone.

The heat capacity and the thermal conductivity of the suscepter, and especially the rotating action, improve the temperature uniformity of the wafer during the heat cycle. Additionally, the combination of the high power radiant heat source for rapid temperature rise and the laser scanning wafer profile measurement provides stress/curvature measurement during rapid thermal cycles. The rotating suscepter allows scans on different lines across the wafer, thus enabling the determination of full three dimensional maps of the wafer at various temperature points during the heat cycle. An additional feature of the current invention is that the temperature of the wafer can be determined by inferred measurement of the suscepter temperature thus avoiding problems of calibration to individual wafer emisitivity values. Additionally, the invention may include multiple gas valves and gas injection into the wafer chamber, allowing measurement of wafer profile during wafer processing.

In another embodiment, uniform heating of the substrate is effected by supporting the substrate on a suscepter and rotating the suscepter and the substrate between a pair of heating elements disposed above and below the substrate and suscepter. Rotation of the wafer and suscepter permits exposure of all the portions of the wafer and suscepter to the heat flux field, effectively cancelling variations in the exposure and achieving more uniform temperature control of the substrate.

DETAILED DESCRIPTION OF THE PREFERRED EMBODIMENTS

Figure 2:
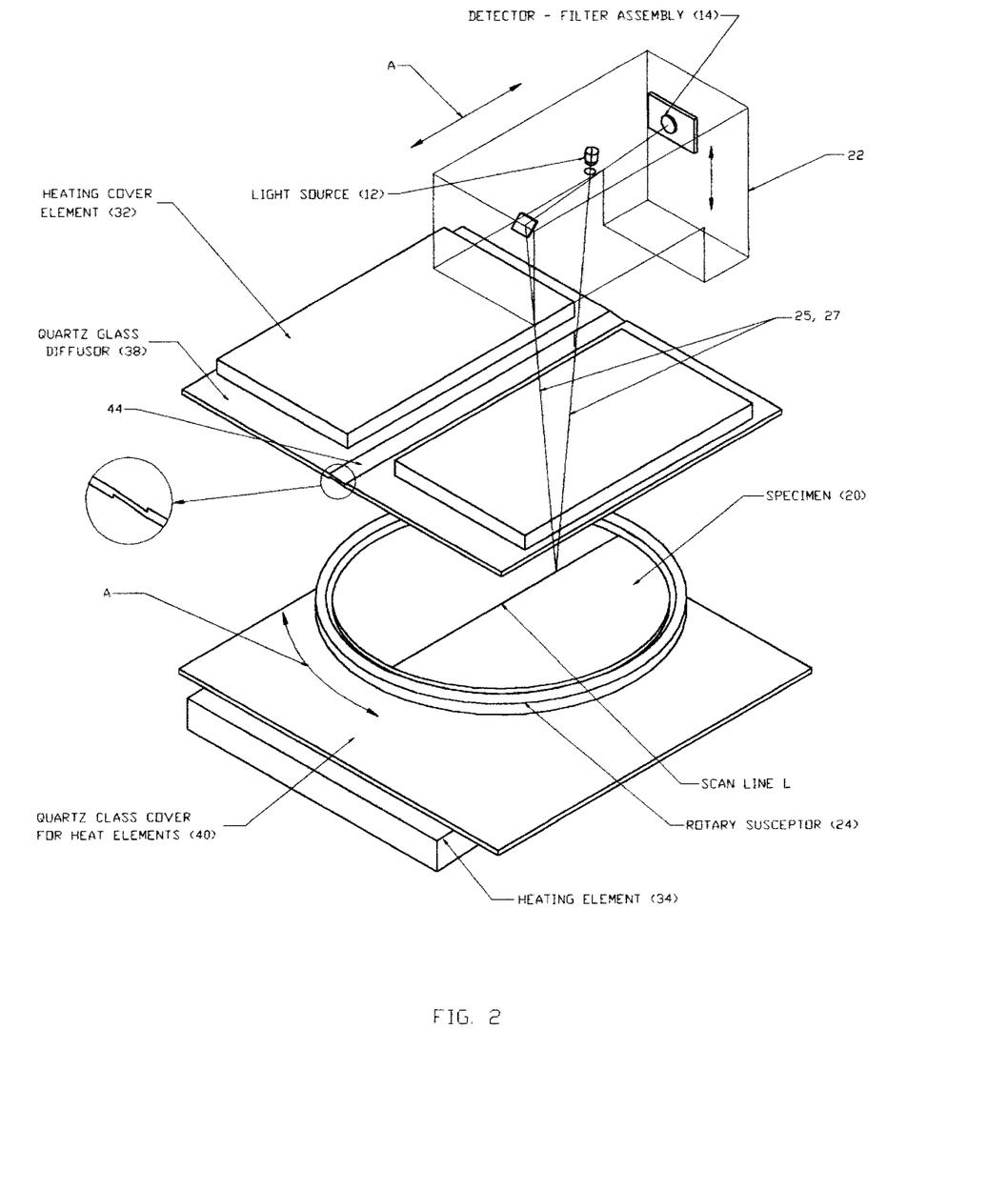
FIG. 2 is a perspective view of an embodiment of the invention.

FIG. 2 illustrates the operation of the preferred embodiment of the invention. The semiconductor substrate 20 is rotatably supported on a susceptor 24. Heating elements 32 and 34 are disposed respectively above and below the substrate and provide radiant heat sources for elevating the temperature of the substrate during rapid thermal processing (RTP). Boundary plates 38, 40 are provided between the heating elements and the substrate in order to seal the process chamber and allow control of the gas surrounding the substrate.

Figure 7:
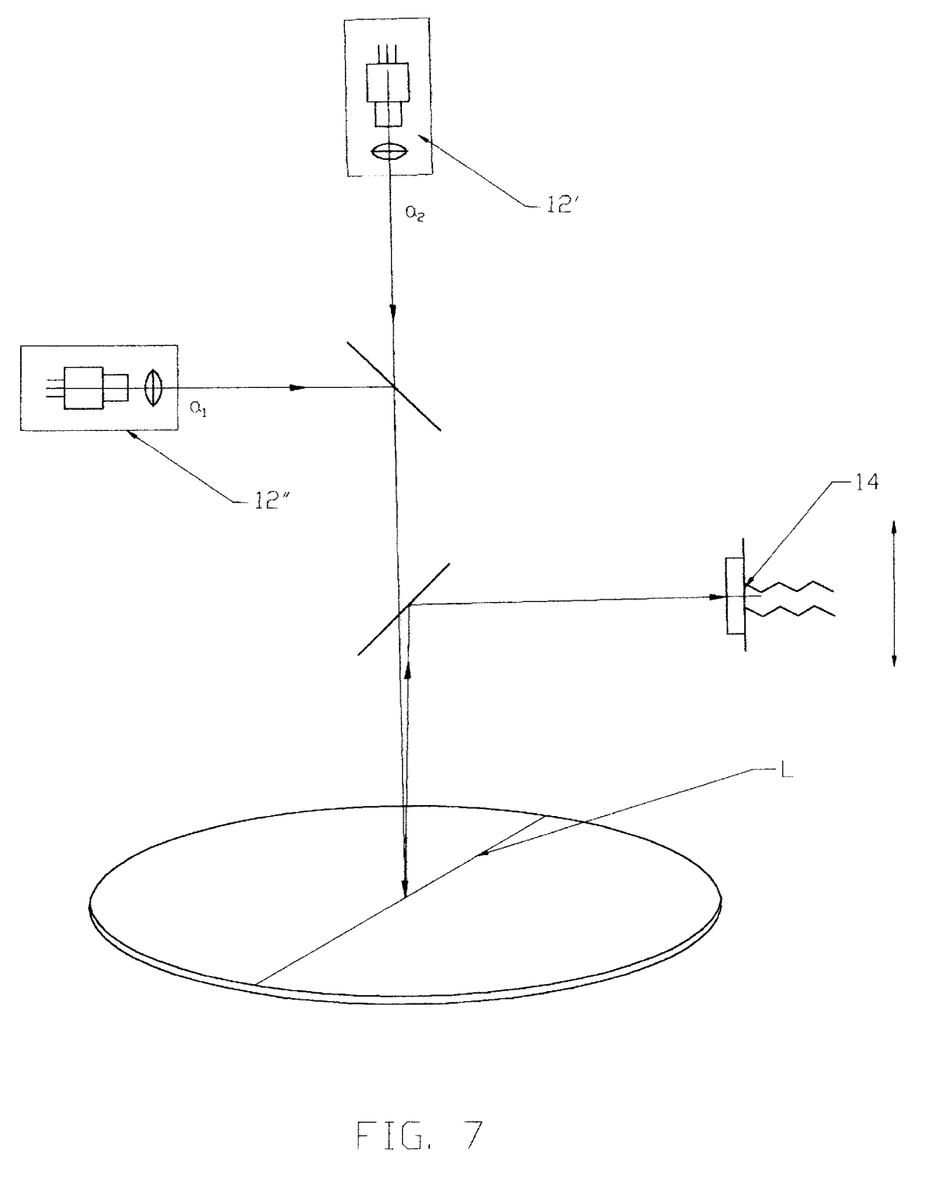
FIG. 7 is a schematic view of a multi-wavelength source.

Curvature of the substrate is detected by sensor 22. Light source 12, which may comprise one or more lasers having different wavelengths (FIG. 7), emits an incident beam 25 onto the substrate 20, and the reflected light beam 27 is sensed by photodetector 14 which generates electrical signals in response thereto. The incident beam 25 is scanned in the direction of arrow A across a diameter of the substrate 20 along scan line L, and a computation is made to indicate the curvature of the surface along the scan line. Additionally, the substrate 20 is rotated about its axis and a sequence of scans are made across the substrate surface along different diameters of the substrate 20. In this manner, a three-dimensional representation of the curvature of the substrate 20 is generated.

Figure 3:
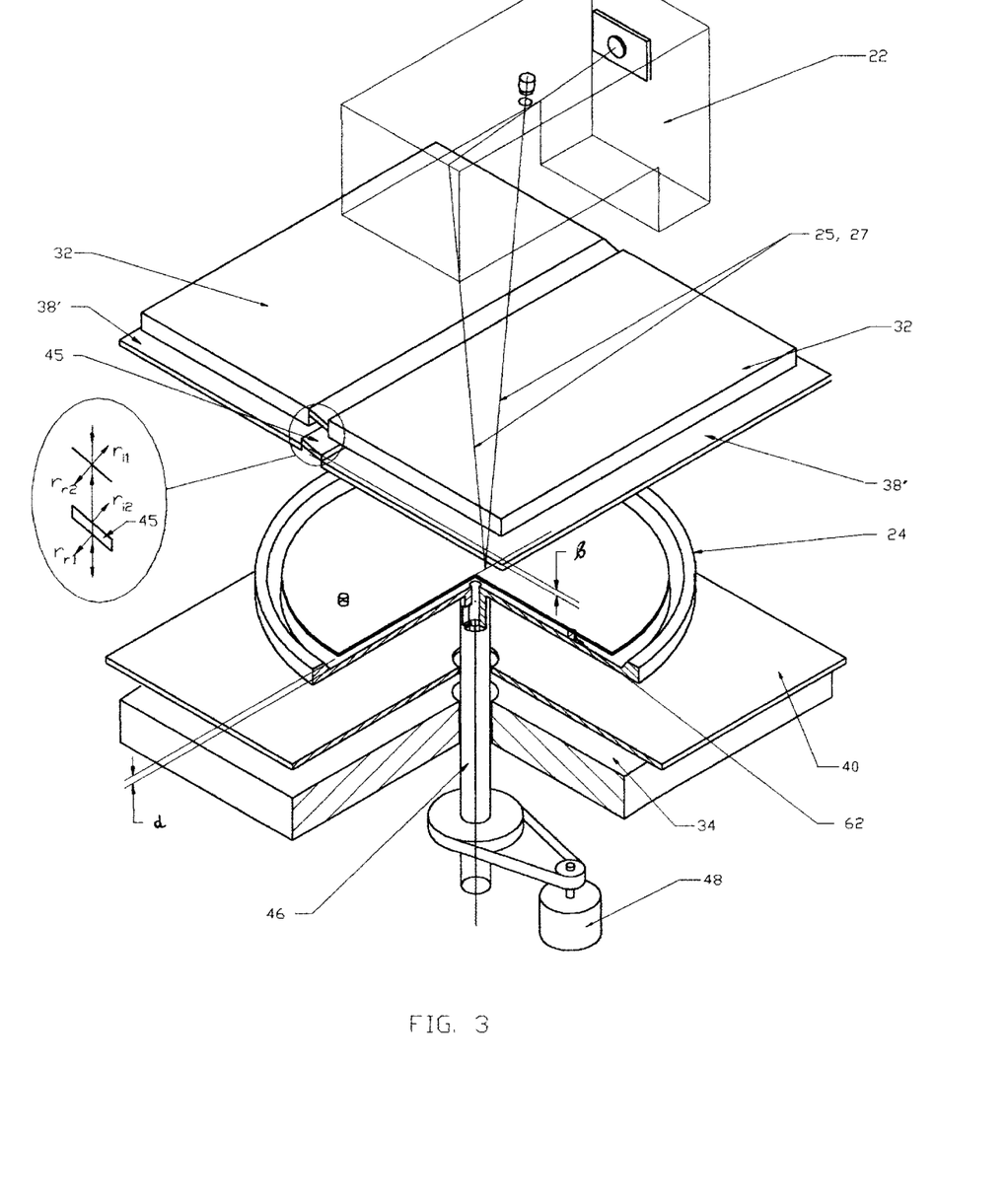
FIG. 3 is a schematic illustration of a side view of the embodiment of FIG. 2.

As shown in FIG. 3, precision rotation of the susceptor 24 is accomplished by a belt driven shaft 46 driven by a stepper motor 48. Alternatively, a servo motor may be used for this purpose. The shaft 46 is either rigidly affixed to the bottom of the susceptor 24, or connects to the susceptor by a disconnectable mechanical interface (not shown).

Beams 25 and 27 traverse heating element 32 and boundary plate 38 along paths parallel to the scan line L and impinge heating element 32 and boundary plate 38 normally thereto. This normal incidence introduces the problem of secondary reflections and resulting "ghosting" in the curvature measurements. To obviate this problem, the invention contemplates several expedients to direct reflected light away from the return path to the sensor 22. Specifically, the linear region along which the beams 25 and 27 impinge the boundary plate during a scan may be machined to achieve inclined surfaces confronting the incident beam 25 and the reflected beam 27. Undesired reflections in this manner are directed away from the measurement path. Alternatively, as illustrated in FIG. 3, the boundary plate may be constructed of two sub-plates 38' and 38", with a gap therebetween. The plates are offset in elevation by a distance β. A third sub-plate 45 is disposed across the gap between the sub-plates 38' and 38" and is inclined at an angle such that the beams 25 and 27 impinge its surfaces obliquely. Such an arrangement, along with a comparable one for heating element 32, effectively operates to prevent deleterious reflections, delineated as "$r_{i1}$", "$r_{i2}$", "$r_{r1}$", and "$r_{r2}$".

The system of the invention utilizes radiant heat sources 32 and 34, which may be either quartz halogen heat lamps or ceramic heaters. Ceramic heaters are capable of cycling the wafer to a temperature of 900° C., and quartz halogen heat lamps are capable of cycling the wafer to 1150° C. The temperature ramp rate using the ceramic heater will exceed 20 degrees per minute over its range, and the temperature ramp rate using the quartz halogen heat lamps will exceed 50 degrees per second over its range. The maximum ramp rates are principally controlled by the watt density of the radiant heat source and the heat capacity of the susceptor 24.

Figure 4:
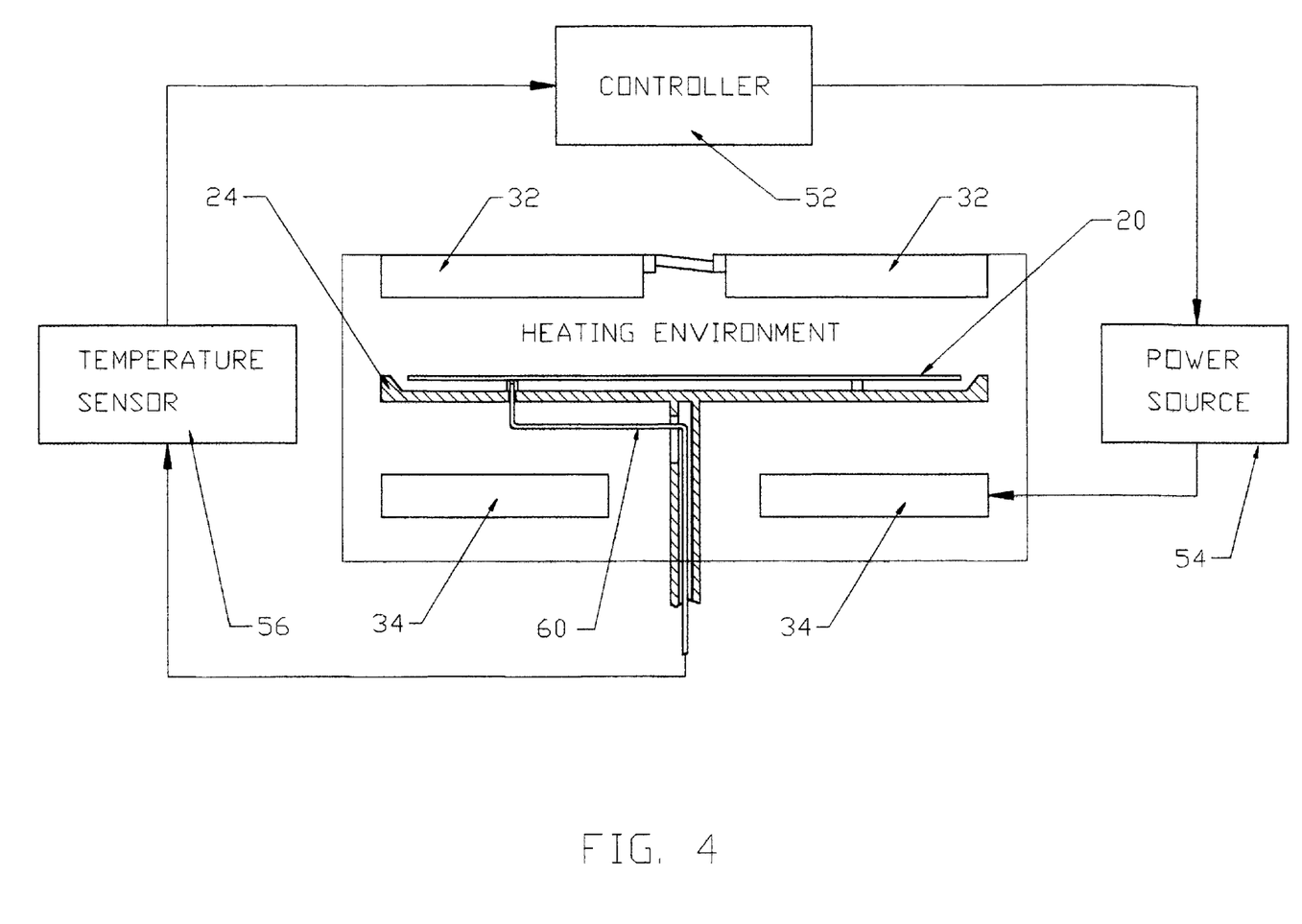
FIG. 4 is a schematic view of temperature control system of the invention.

The temperature cycle is controlled using conventional feedback temperature control methods as illustrated in FIG. 4. A central controller 52 outputs control signals to a power source 54 which controls the energy input to the heating elements 32 and 34. Control of solid state relays (not shown) in the power lines 70 feeding the heater elements may be used to control the heating elements 32 and 34. The solid state relays may also be controlled directly by the computer controlling the scanning, or by a commercially available modular temperature controller under the direction of the computer controlling the scanning.

Figure 5:
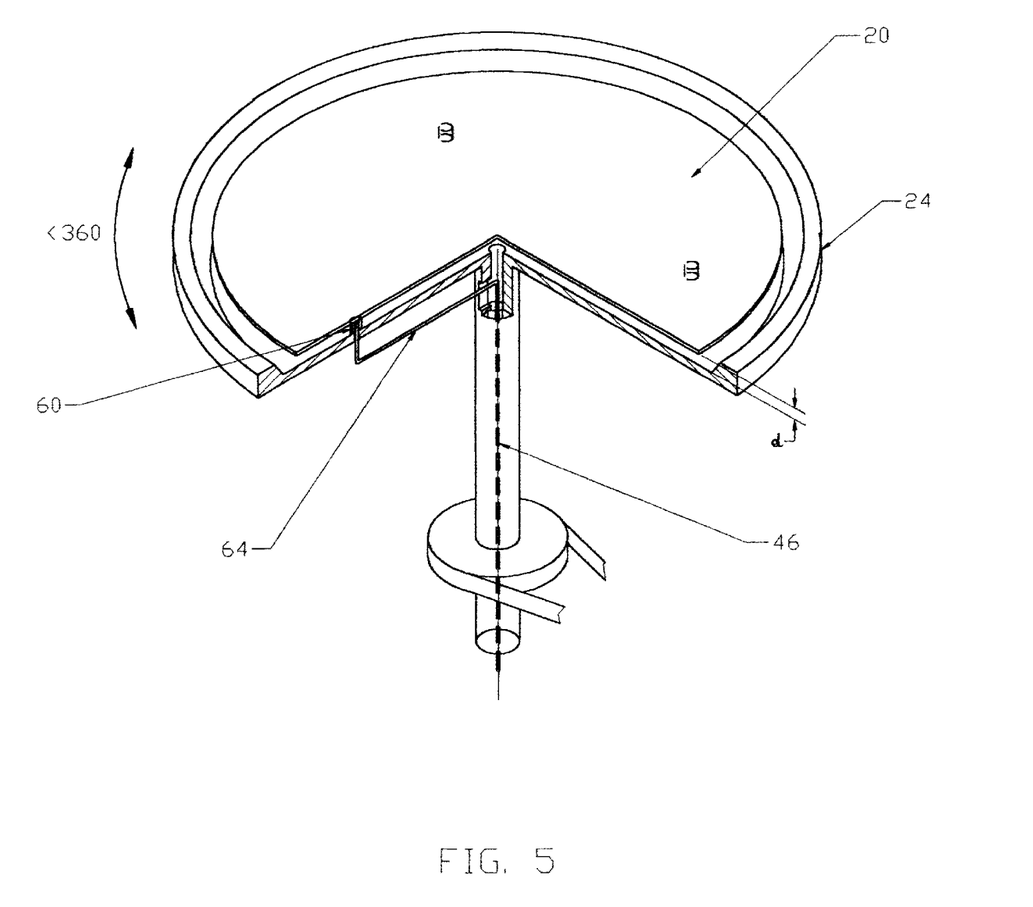
FIG. 5 is a perspective view of the rotating susceptor and support points of the invention.

The central controller 52 receives inputs indicating susceptor temperature as measured by a temperature sensor 56. Sensor 56 may derive its measurements through detection of the emissivity of either the wafer or the susceptor. Alternatively, the temperature of the wafer 20 can be inferred from a thermocouple device 60 disposed in close proximity with the wafer, as illustrated in FIG. 5. The thermocouple may be provided as one of the support points between the wafer and the susceptor. At least two other support points, 62 and 64, are provided to retain the proper clearance α between the wafer 20 and susceptor 24. In the embodiment of FIG. 5, the rotation of the susceptor by the stepper motor is confined to a prescribed range to accommodate the electrical leads 64 of the thermocouple 60 and protect them from excess twist. The susceptor 20 is then oscillated, via shaft 46 and motor 48, within the prescribed range, which is preferably less than 360°.

Various combinations of heating elements, including the heater wattage and surface watt density, heater placement relative to the suscepter, heater power connections, and temperature control circuits can be utilized to provide desired temperature ramp rates, temperature uniformity, and cycle temperatures. The power provided from the top (the wafer side of the suscepter), through heating element 32, is generally less than the power provided from the bottom (heating the wafer through the suscepter), through heating element 34. The watt density on the top may typically be from 10 to 50 percent less than the watt density from the bottom, and is influenced by the size and material of the suscepter 24, as well as the respective distances of the suscepter from the top and bottom heat sources.

The suscepter 24 is typically made from graphite if oxidizing gasses are not used. Silicon carbide, ceramic and quartz can be used in alternate embodiments. The suscepter provides three point contact to the bottom of the wafer, and a very small gap α (FIG. 3) between the suscepter and the noncontacted portions of the wafer. This gap is sized to be as small as practical while providing sufficient space to avoid contact with the maximum expected wafer bow. The suscepter 24 also incorporates a wafer positioning reference (not shown) which enables the user to position the wafer consistently and support reproducible results.

The chamber surrounding the suscepter 24 includes optically clear quartz plates 38, 40 between the suscepter and the radiant heat sources 32 and 34, and includes heat reflective surfaces on the four surrounding sides (not shown). The top quartz plate 38 includes a section 44 along the laser scan line with both surfaces tilted at an angle to the horizontal such that when the laser beam from light source 12 in the sensor device 22 is perpendicular to the quartz plate 38, it is not perpendicular to the two surfaces of the section 44 in the laser beam path. Thus, any surface reflections of the laser beam are not reflected back toward the sensor device 22 and the detector 14 therein. This can be accomplished by machining surfaces on a single quartz plate as seen in FIG. 2, or by constructing the plate from three pieces of quartz with a narrow center piece placed at an angle relative to the horizontal plane of the other two quartz pieces (FIG. 3).

Figure 6:
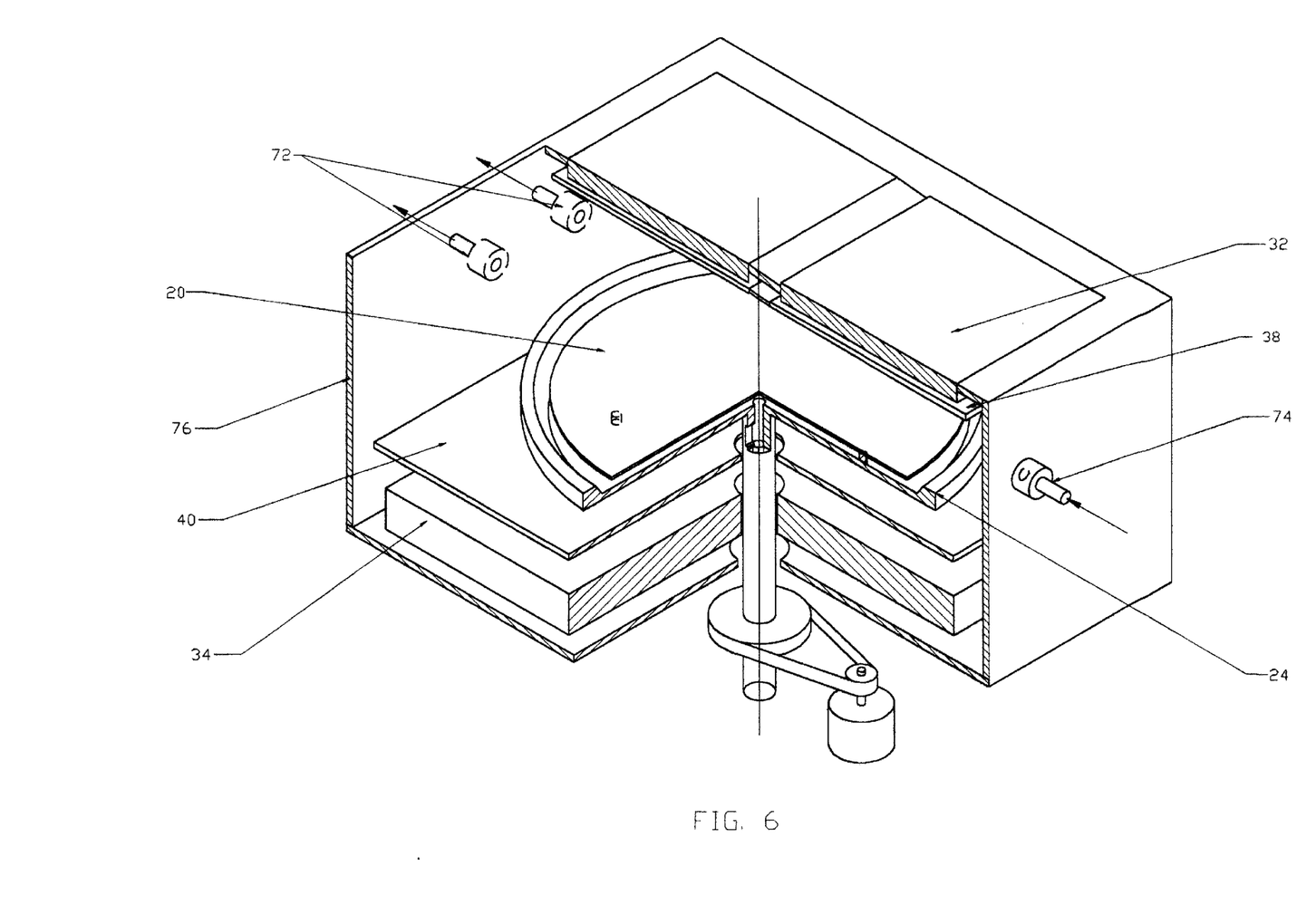
FIG. 6 is a perspective view illustrating the gas flow into the chamber in accordance with the invention.

As seen in FIG. 6, the chamber 76, whose boundaries include the quartz plates 38 and 40, is partially sealed. Purge gas and process gasses are injected into the chamber through nozzles 74 and cause a flow of the prior gas out from the chamber and thus form the atmosphere surrounding the substrate 20. The chamber 76 is partially sealed, allowing gas to be forced slowly out of the chamber and recaptured in exit valves 72.

The substantial temperatures reached by the system of the invention require a method of removing unwanted heat. This can be accomplished with a water jacket or with a forced air system as is known in the art, or with a combination of the two. In any case, the result is that the temperatures on the outside of the system are held to temperatures that are not hazardous to operators, and the cooling portion of the cycle is able to dissipate the heat stored in the suscepter and wafer.

What is claimed is:

1. A method for measuring the curvature of a substrate comprising:

providing at least one radiant heat source for radiating heat onto the substrate;

rotating the substrate relative to the radiant heat source;

scanning a substrate surface with a sensing means to generate output signals indicative of curvature, said scanning comprising:
   directing an incident light beam at the substrate surface;
   displacing the incident light beam along a prescribed scan line; and detecting the incident light beam, as a reflection beam, after reflection by the substrate surface; and developing a data map representative of the curvature of the substrate during a rapid thermal processing (RTP) cycle using the generated output signals.

2. The method of claim 1, wherein the rotating step comprises supporting the substrate on a suscepter and rotating said suscepter.

3. The method of claim 1, wherein the incident beam is generated by a plurality of monochromatic light sources of differing wavelengths.

4. An apparatus for measuring heat-induced curvature of a substrate comprising:

heating means for controllably varying the temperature of the substrate;

sensing means for emitting an incident light beam and generating output signals indicative of a relative inclination between a substrate surface and the incident light beam along a sensing direction;

displacing means for effecting a relative displacement between the sensing means and the substrate, the displacing means comprising a rotation means for rotating the substrate and a translation means for effecting a relative translation of the sensing means and the substrate along the sensing direction; and processing means adapted to generate from said output signals a data map representative of substrate curvature in three-dimensional space during a rapid thermal processing (RTP) cycle.

5. The apparatus of claim 4, wherein the sensing means comprises:

at least one light source adapted to direct the incident light beam onto the substrate along the sensing direction; and at least one photodetector for detecting reflection light reflected by the substrate.

* * * * *